United States Patent
Widmer et al.

(10) Patent No.: US 6,845,057 B2
(45) Date of Patent: Jan. 18, 2005

(54) DDR SYNCHRONOUS FLASH MEMORY WITH VIRTUAL SEGMENT ARCHITECTURE

(75) Inventors: Kevin C. Widmer, San Carlos, CA (US); Cliff Zitlaw, San Jose, CA (US); Frankie Fariborz Roohparvar, Milpitas, CA (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 10/668,443

(22) Filed: Sep. 23, 2003

(65) Prior Publication Data

US 2004/0057284 A1 Mar. 25, 2004

Related U.S. Application Data

(63) Continuation of application No. 10/102,757, filed on Mar. 21, 2002, now Pat. No. 6,654,307, which is a continuation-in-part of application No. 09/928,621, filed on Aug. 13, 2001, now Pat. No. 6,625,081.

(51) Int. Cl.$^7$ ................................................ G11C 8/00
(52) U.S. Cl. ............................ 365/230.03; 365/230.08; 365/230.09; 365/233; 365/185.11; 365/185.33
(58) Field of Search ....................... 365/230.03, 230.08, 365/230.09, 233, 185.11, 185.33

(56) References Cited

U.S. PATENT DOCUMENTS

| | | | |
|---|---|---|---|
| 5,646,893 A | 7/1997 | McMinn et al. | |
| 6,157,560 A | 12/2000 | Zheng | |
| 6,172,893 B1 | 1/2001 | Ryan | |
| 6,215,710 B1 * | 4/2001 | Han et al. | 365/193 |
| 6,236,618 B1 | 5/2001 | Roy | |
| 6,335,874 B1 | 1/2002 | Eitan | |
| 6,396,764 B1 | 5/2002 | Holland | |
| 6,442,076 B1 | 8/2002 | Roohparvar | |

* cited by examiner

*Primary Examiner*—Richard Elms
*Assistant Examiner*—Toan Le
(74) *Attorney, Agent, or Firm*—Leffert Jay & Polglaze, P.A.

(57) ABSTRACT

An improved memory device and architecture has been detailed that enhances a Flash memory device that has an SDRAM compatible interface. The memory device employs a virtual paging scheme that allows for the architecture of the memory to implement an efficient Flash memory structure internally. Externally, the memory logically maps the internal Flash architecture to an SDRAM compatible interface and virtual architecture, allowing for memory access and operation with a compatible SDRAM controller device. A double data rate interface is provided to allow data to be input and output from the memory in synchronization with both rising and falling edges of a clock signal.

37 Claims, 7 Drawing Sheets

DDR SYNCHRONOUS FLASH MEMORY WITH VIRTUAL SEGMENT ARCHITECTURE

This Application is a Continuation of U.S. application Ser. No. 10/102,757 filed Mar. 21, 2002 now U.S. Pat. No. 6,654,307, which is a Continuation-in-part of U.S. patent Ser. No. 09/928,621, filed Aug. 13, 2001, and issued as U.S. Pat. No. 6,625,081 on Sep. 23, 2003.

TECHNICAL FIELD OF THE INVENTION

The present invention relates generally to non-volatile memory devices and in particular the present invention relates to double data rate synchronous non-volatile flash memory with virtual segment architecture.

BACKGROUND OF THE INVENTION

Memory devices are typically provided as internal storage areas in the computer. The term memory identifies data storage that comes in the form of integrated circuit chips. There are several different types of memory used in modem electronics, one common type is RAM (random-access memory). RAM is characteristically found in use as main memory in a computer environment. RAM refers to read and write memory; that is, you can both write data into RAM and read data from RAM. This is in contrast to ROM, which permits you only to read data. Most RAM is volatile, which means that it requires a steady flow of electricity to maintain its contents. As soon as the power is turned off, whatever data was in RAM is lost.

Computers almost always contain a small amount of read-only memory (ROM) that holds instructions for starting up the computer. Unlike RAM, ROM cannot be written to. An EEPROM (electrically erasable programmable read-only memory) is a special type non-volatile ROM that can be erased by exposing it to an electrical charge. Like other types of ROM, EEPROM is traditionally not as fast as RAM. EEPROM comprise a large number of memory cells having electrically isolated gates (floating gates). Data is stored in the memory cells in the form of charge on the floating gates. Charge is transported to or removed from the floating gates by programming and erase operations, respectively.

Yet another type of non-volatile memory is a Flash memory. A Flash memory is a type of EEPROM that can be erased and reprogrammed in blocks instead of one byte at a time. Many modern PCs have their BIOS stored on a flash memory chip so that it can easily be updated if necessary. Such a BIOS is sometimes called a flash BIOS. Flash memory is also popular in modems because it enables the modem manufacturer to support new protocols as they become standardized.

A typical Flash memory comprises a memory array, which includes a large number of memory cells. Each of the memory cells includes a floating gate field-effect transistor capable of holding a charge. The cells are usually grouped into blocks. Each of the cells within a block can be electrically programmed in a random basis by charging the floating gate. The charge can be removed from the floating gate by a block erase operation. The data in a cell is determined by the presence or absence of the charge in the floating gate.

Both RAM and ROM random access memory devices have memory cells that are typically arranged in an array of rows and columns. During operation, a row (page) is accessed and then memory cells can be randomly accessed on the page by providing column addresses. This access mode is referred to as page mode access. To read or write to multiple column locations on a page requires the external application of multiple column addresses. To increase access time, a burst mode access has been implemented. The burst mode uses an internal column address counter circuit to generate additional column addresses. The address counter begins at an externally provided address and advances in response to an external clock signal or a column address strobe signal.

A synchronous DRAM (SDRAM) is a type of DRAM that can run at much higher clock speeds than conventional DRAM memory. SDRAM synchronizes itself with a CPU's bus and is capable of running at 100 MHZ or 133 MHZ, about three times faster than conventional FPM (Fast Page Mode) RAM, and about twice as fast EDO (Extended Data Output) DRAM and BEDO (Burst Extended Data Output) DRAM. An extended form of SDRAM that can transfer a data value on the rising and falling edge of the clock signal is called double data rate SDRAM (DDR SDRAM, or simply, DDR). SDRAM's can be accessed quickly, but are volatile. Many computer systems are designed to operate using SDRAM, but would benefit from non-volatile memory. A synchronous Flash memory has been designed that allows for a non-volatile memory device with an SDRAM interface. Although knowledge of the function and internal structure of a synchronous Flash memory is not essential to understanding the present invention, a detailed discussion is included in U.S. patent application Ser. No. 09/627,682 filed Jul. 28, 2000 and titled, "Synchronous Flash Memory," which is commonly assigned and incorporated by reference.

In general, the goal of synchronous Flash is to mimic the architecture of SDRAM. It has an SDRAM interface which is compatible to SDRAM for read operation to the synchronous Flash memory. Programming, erasing, block protection and other flash specific function differ from SDRAM and are performed with a three cycle SDRAM command sequence. Unfortunately, the general internal architecture of conventional SDRAM memory is not the most efficient architecture for non-volatile memories and for Flash memory specifically.

For the reasons stated above, and for other reasons stated below which will become apparent to those skilled in the art upon reading and understanding the present specification, there is a need in the art for a non-volatile memory device that can operate in a manner similar to SDRAM operation and maintain an internal architecture that is more applicable to non-volatile memory device access and power efficiencies.

SUMMARY OF THE INVENTION

The above-mentioned problems with memory devices and other problems are addressed by the present invention and will be understood by reading and studying the following specification.

In one embodiment, a synchronous non-volatile memory device comprises an array of memory cells arranged in a plurality of addressable banks of the memory cells. The memory cell rows of each bank are divided into a plurality of addressable column segments. Latch circuitry is coupled to each of the plurality of addressable banks. The latch circuitry includes a plurality of segment latches to store data read from the plurality of addressable segments. Control circuitry is provided to read data from the plurality of addressable banks and store the read data in the latch circuitry. A first segment row from a first segment of the plurality of addressable segments and a second segment of the plurality of addressable segments is latched in the latch circuitry to form a virtual row of data. Output circuitry communicates the data of the virtual row stored in the latch circuitry on data connections in synchronization with rising and falling edges of an externally provided clock signal.

DETAILED DESCRIPTION OF THE INVENTION

In the following detailed description of the preferred embodiments, reference is made to the accompanying drawings that form a part hereof, and in which is shown by way of illustration specific preferred embodiments in which the inventions may be practiced. These embodiments are described in sufficient detail to enable those skilled in the art to practice the invention, and it is to be understood that other embodiments may be utilized and that logical, mechanical and electrical changes may be made without departing from the spirit and scope of the present invention. The following detailed description is, therefore, not to be taken in a limiting sense, and the scope of the present invention is defined only by the claims.

A conventional synchronous Flash memory matches the internal architecture and simulates the operation of an SDRAM memory quite closely. In contrast, a virtual synchronous flash memory of the present invention changes the internal architecture, while maintaining a compatible conventional SDRAM interface. This allows it to better match the efficiencies of the underlying memory technology. The resulting memory structure of a virtual synchronous Flash internal memory array is then logically reassembled to simulate an SDRAM configuration for the purposes of interfacing to a standard SDRAM compatible memory controller, processor, or other compatible external device. The virtual synchronous Flash memory of the present invention allows for additional memory address pins to be added to the external address interface so as to enable external devices with the appropriate capability to access the internal architecture of the virtual synchronous Flash memory directly.

Figure 1:
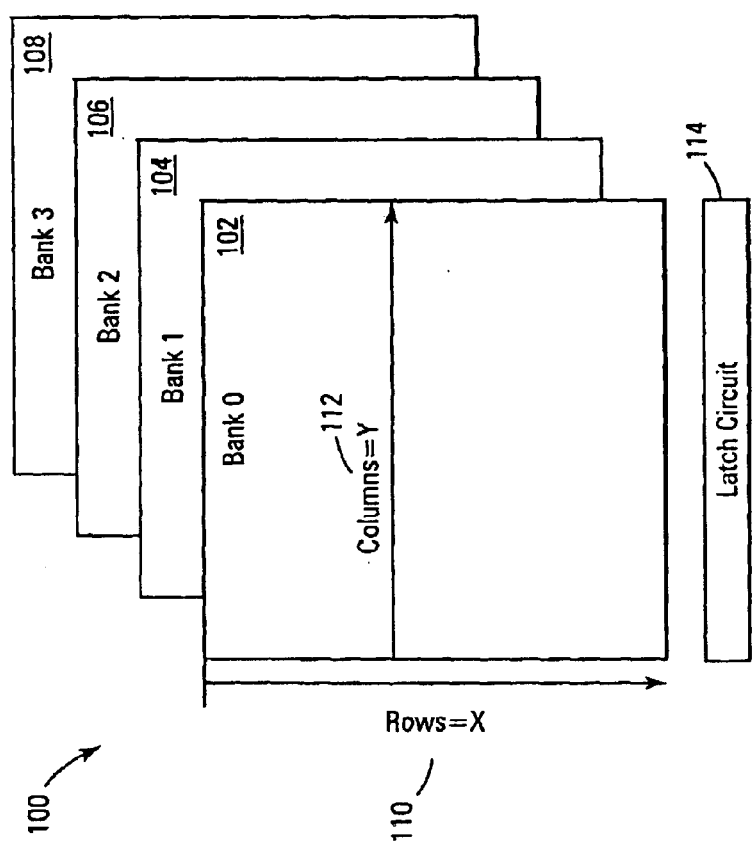
FIG. 1 illustrates a prior art SDRAM memory array with four banks of memory within the array.

FIG. 1 is a simplified diagram of a prior art SDRAM memory array architecture. SDRAM memory arrays generally consist of a sequence of memory array banks that have rows and columns. The SDRAM memory arrays, upon being accessed with a bank, row, and column address, load an internal data latch circuit with a defined number of bits. The SDRAM memory array 100 of FIG. 1 has four array banks 102, 104, 106, and 108. Each of the four banks 102, 104, 106, and 108 in turn has X rows 110 and Y columns 112. When a bank and row are selected by an input row address, the contents of a row of memory cells are placed on column bit lines coupled to sense amplifiers (not shown) and the bit values of the memory cells are detected. The selected memory array row, and therefore the contents of the sense amplifiers, is generally called the active row page. The values detected by the sense amplifiers are latched in latch circuit 114. An input column address to the SDRAM, which defines the column page, selects from the latches of the latch circuit 114, and thus from the columns of the active row page, the Z number of bit values to be latched by an internal data buffer (not shown). The Z data bits are held in the internal data buffer for transfer from the SDRAM memory device through the data interface (not shown). An example of a common SDRAM memory is a 4M×32 SDRAM, which has 4 banks, 4,096 rows, 256 columns, and 32 bits. However, SDRAM memories come in multiple densities and bus widths, for example 8M×8, 4M×16, 4M×32, 2M×32, and 8M×16 to list a few.

An SDRAM memory read operation generally starts with an "ACTIVE" command that sets the bank and row address, by reading in an address placed on the address interface to the SDRAM memory device. The "ACTIVE" command thus activates the active row page and places it on the internal sense amplifiers to be read and latched by internal latch circuits. The column address is read in from the address interface by a following "READ" command that sets the column page by selecting columns from the latch circuits to place in an internal data buffer in the SDRAM memory device. The SDRAM command sequence is then finished on the next clock cycle with a data word transfer from the internal data buffer.

In an SDRAM compatible command sequence, before any READ or WRITE commands can be issued to a bank within the synchronous flash memory, a row in that bank must be "opened." This is accomplished via an ACTIVE command, which is used to open (or activate) a row in a particular array bank for a subsequent access. The value on the BA0, BA1 inputs selects the bank, and the address provided on inputs A0–A11 selects the row. This row remains active for accesses until the next ACTIVE command, power-down or RESET.

A subsequent ACTIVE command to a different row in the same bank can be issued without having to close a previous active row, provided the minimum time interval between successive ACTIVE commands to the same bank is met. A subsequent ACTIVE command to another bank can also be issued while the first bank is being accessed, which results in a reduction of total row access overhead.

After an ACTIVE command to activate a row in the memory, the READ command is used to initiate a read access to an active row. The value on the BA0, BA1 inputs selects the bank, and the address provided on inputs A0–A7 selects the starting column location. Read data appears on data outputs, the DQs (not shown) of the data interface (not shown) subject to the logic level on the data mask (DQM) input that is sometimes used to mask data DQ outputs and values not needed for the current memory access operation.

During READ bursts, the valid data-out element from the starting column address is available following a specified latency after the READ command. In SDRAM compatible memory, each subsequent data-out element is valid by the next positive clock edge. Upon completion of a burst, assuming no other commands have been initiated, all data outputs go as to a high impedance state. A full page burst continues until terminated. (At the end of the page, it wraps to column 0 and continue.) Data from any READ burst may be truncated with a subsequent READ command, and data from a fixed-length READ burst may be immediately followed by data from a subsequent READ command. In either case, a continuous flow of data can be maintained. The first data element from the new burst follows either the last element of a completed burst, or the last desired data element of a longer burst that is being truncated. A READ command can be initiated on any clock cycle following a previous READ command. Full-speed, random read accesses within a page can be performed, or each subsequent READ may be performed to a different bank.

A fixed-length or full-page READ burst can be truncated with either ACTIVE TERMINATE (may or may not be bank specific) or BURST TERMINATE (not bank specific) commands. Data from any READ burst may also be truncated with a subsequent WRITE command (WRITE commands must be preceded by WRITE SETUP), and data from a fixed-length READ burst may be immediately followed by data from a subsequent WRITE command (subject to bus turnaround limitations). The WRITE may be initiated on the clock edge immediately following the last (or last desired) data element from the READ burst, provided that 110 contention can be avoided.

Figure 2:
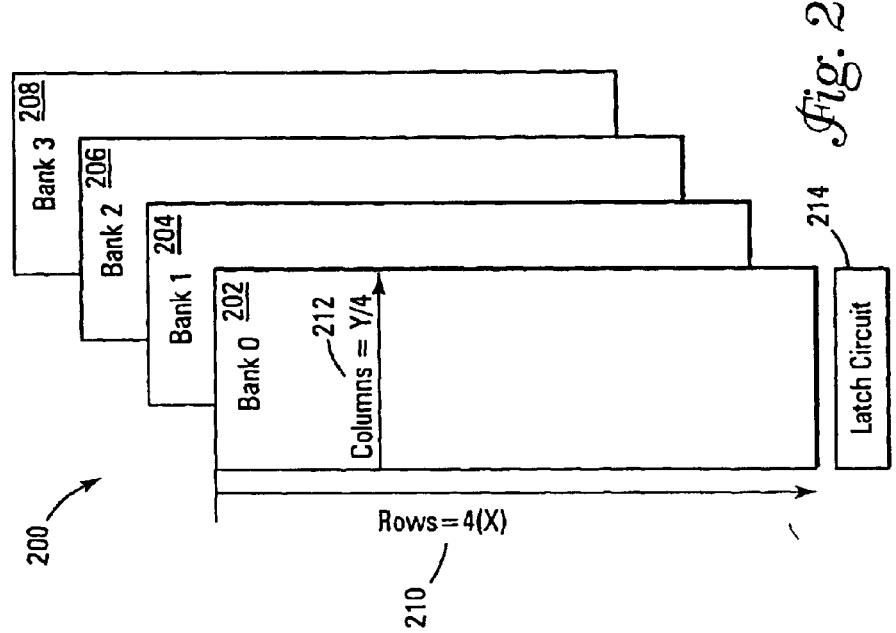
FIG. 2 illustrates a virtual synchronous flash memory array of the present invention with four banks of memory within the array.

As stated above, a virtual synchronous flash memory of the present invention changes the internal architecture, while maintaining a compatible conventional SDRAM interface. This allows it to better match the efficiencies of the underlying memory technology. FIG. 2 details a simplified diagram of a memory array of a virtual synchronous Flash of the present invention. The resulting memory structure of a virtual synchronous Flash internal memory array is then logically reassembled to simulate an SDRAM configuration for the purposes of interfacing to a standard SDRAM compatible memory controller, processor, or other compatible external device. The virtual synchronous Flash memory of the present invention allows for additional memory address pins to be added to the external address interface so as to enable external devices with the appropriate capability to access the internal architecture of the virtual synchronous Flash memory directly.

To accomplish this goal, the virtual synchronous Flash memory of the present invention internally reduces the effective column length of a memory array bank to one-fourth the column length of a corresponding SDRAM memory device. In addition, the number of rows of a memory array bank is increased to four times the number of rows of a corresponding SDRAM memory device, maintaining the same overall memory density. It is noted that other internal memory array configurations are possible and would be apparent to those skilled in the art.

The virtual synchronous Flash memory array 200 of FIG. 2 is shown with four array banks 202, 204, 206, and 208. Each of the four banks 202, 204, 206, and 208 in the memory array in turn has 4(X) rows 210 and Y/4 columns 212. When a bank and row are selected by an input row address, the contents of a row of memory cells is placed on column bit lines coupled to sense amplifiers (not shown) and the bit values of the memory cells are detected. The selected memory array row, and contents of the sense amplifiers, is called the active row page. The values detected by the sense amplifiers are latched in by latch circuit 214. An input column address to the virtual synchronous Flash, which defines the column page, selects from the latches of the latch circuit 214, and thus from the columns of the active row page, the Z number of bit values to be latched by an internal data buffer (not shown). The Z data bits are held in the internal data buffer for transfer from the virtual synchronous Flash memory device through the data interface (not shown). From the above example, a 4M×32 SDRAM, which has 4 banks, 4,096 rows, 256 columns, and 32 bits, would correspond to a 4M×32 virtual synchronous Flash that internally has 4 banks, 16,384 rows, 64 columns, and 32 bits.

Figure 4:
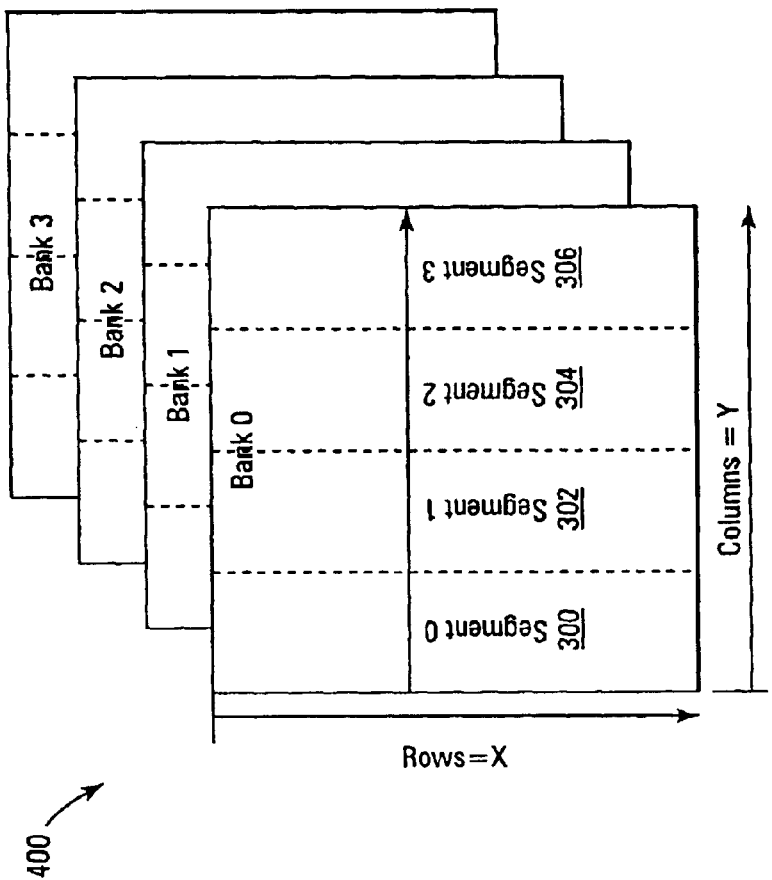
FIGS. 3 and 4 illustrate a virtual synchronous Flash memory array of the present invention subdivided into segments and the segments being mapped into a virtual SDRAM memory array.
Figure 3:
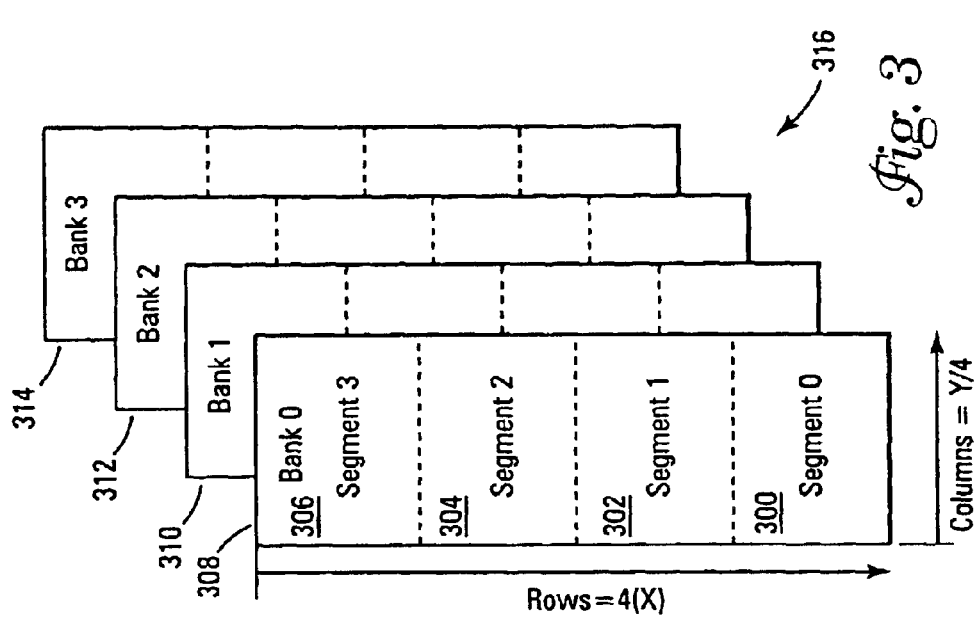

A process for logically reassembling the internal rows and columns of the virtual synchronous Flash of FIG. 2 to map to a comparable conventional SDRAM configuration is shown in FIGS. 3 and 4. In FIG. 3, each of the four banks 308, 310, 312, and 314 of the internal memory array 316 of the virtual synchronous Flash of FIG. 2, which has 4(X) rows and Y/4 columns, is shown in FIG. 3. As detailed in FIG. 2, each of the virtual synchronous Flash internal memory array banks is divided by row range into four segments 300, 302, 304, and 306. The number of rows in each separate segment of FIG. 3 is equal to the overall X number of rows in the SDRAM that the virtual synchronous Flash is compatible with. The segments 300, 302, 304, and 306 of each separate bank of the virtual synchronous Flash are then logically mapped by arranging them in a virtual manner side by side into a corresponding virtual memory bank 400 that is X rows long and Y columns wide, as shown in FIG. 4, matching a corresponding compatible SDRAM device. It is noted that other methods of logically mapping a virtual synchronous Flash memory to match an SDRAM are possible and would be apparent to those skilled in the art with the benefit of the present disclosure.

In the example previously given of a 4M×32 memory device, a 4M×32 virtual synchronous Flash using the technique of FIGS. 3 and 4 internally has 4 banks, 16,384 rows, 64 columns, and 32 bits. Each bank is logically divided into 4 segments of 4,096 rows and 64 columns each. The segments of each bank are logically mapped to form a virtual bank of 4,096 rows and 256 columns. This procedure can be used on each bank to allow the 4M×32 virtual synchronous Flash to simulate a 4M×32 synchronous SDRAM compatible memory device, which has 4 banks, 4,096 rows, 256 columns, and 32 bits.

Figure 5:
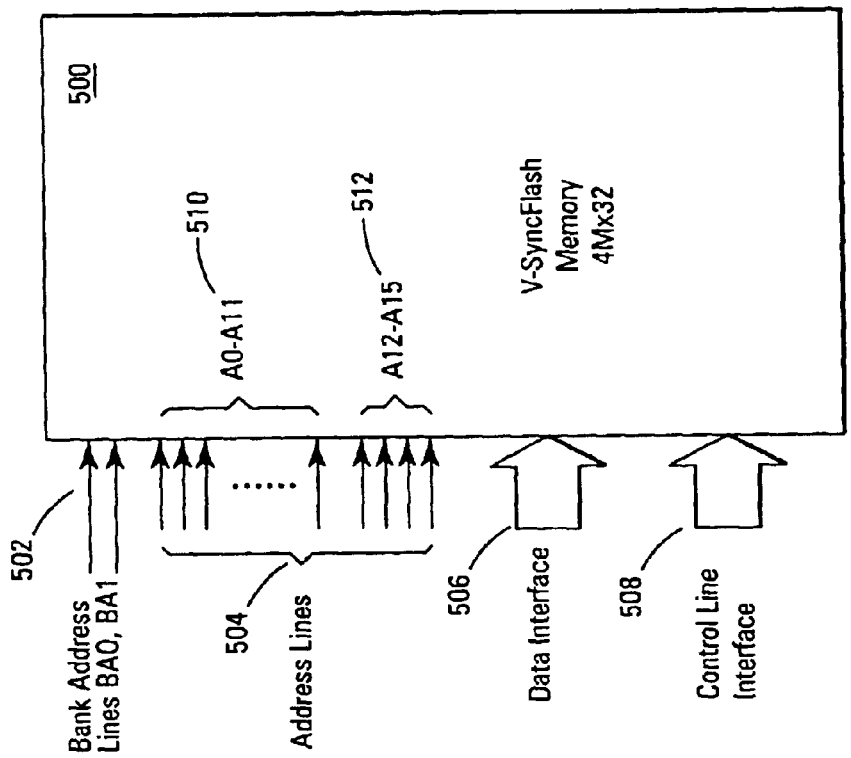
FIG. 5 illustrates a block diagram example of a 4M×32 virtual synchronous Flash memory, showing address, control and data interfaces.

FIG. 5 is a simplified external diagram of a 4M×32 virtual synchronous Flash memory device 500 of an embodiment of the present invention, showing external connections, major interfaces, and extended virtual synchronous Flash address lines. The virtual synchronous Flash memory device 500 of FIG. 5 includes bank address lines BA0–BA1 502, address lines A0–A15 504, data interface 506, and control line interface 508. The bank address lines BA0–BA1 502 select the desired memory array bank for a subsequent access. The data interface 506 transfers data to and from the virtual synchronous Flash memory device 500. The control line interface 508 contains the signal lines necessary to control the virtual synchronous Flash memory device 500 in its operation, such as, but not limited to, CS, DQS, clock, CAS, RAS, and WE. Depending on the SDRAM command being issued the values placed on the address lines A0–A15 504 select the row or column of the memory array for an access. The address lines A0–A15 are additionally split into two separate subsections, A0–A11 510 and A12–A15 512. The addresses in subsection A0–A11 510 allow standard SDRAM compatible row and column memory address accesses to the virtual synchronous Flash memory device 500. The additional address lines in subsection A12–A15 512 are not necessary for SDRAM compatible memory access, but if used by an extended capability SDRAM control device, address lines A12–A15 512 allow access to extended virtual synchronous Flash capabilities and internal architecture. The virtual synchronous Flash uses address lines A12–A13 for access to the extended internal Flash memory array row addresses. Address lines A14–A15 are used to set the extended internal Flash memory array segment address.

A virtual synchronous Flash of the present invention is compatible with conventional SDRAM interfaces and commands, such as detailed above. In addition, virtual synchronous Flash supports extended operations to allow Flash specific operations and to allow direct access to the extended rows and columns of the internal memory array architecture. Direct access to the extended rows and columns without logical re-mapping of the rows and columns to a compatible SDRAM configuration is enabled by the additional address interface lines optionally fitted to the virtual synchronous Flash memory device, such as A12–A15 512 of FIG. 5.

Figure 6:
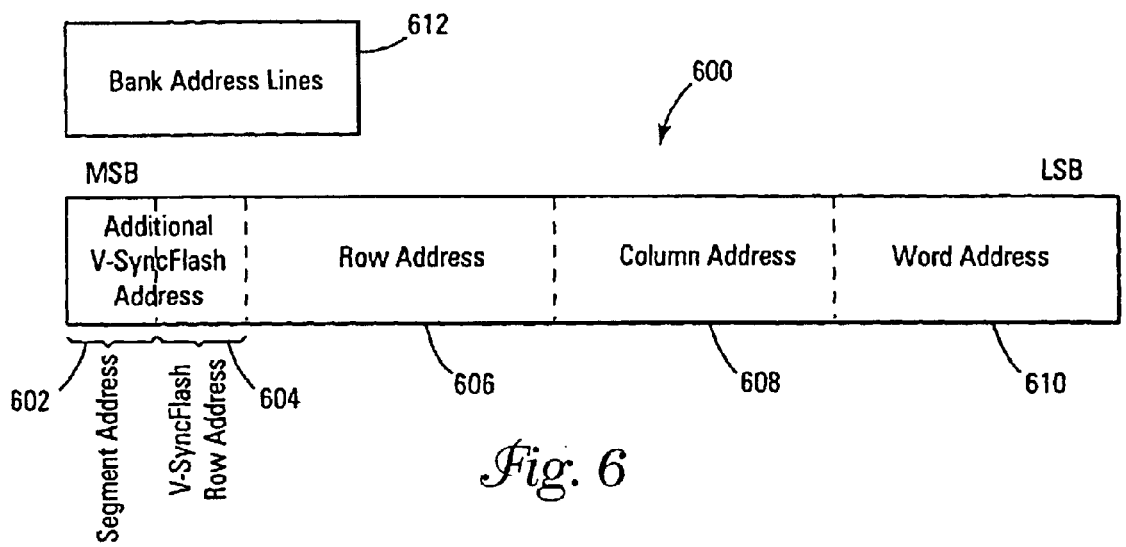
FIG. 6 is a diagram of a memory address for a virtual synchronous Flash, showing bank address, additional virtual synchronous Flash addresses, row address, and column address.

An example of a virtual synchronous Flash address space 600 is shown in FIG. 6. The virtual synchronous Flash address space of FIG. 6 matches the address space of the SDRAM it is compatible with and contains a row address 606, a column address 608, a word address 610, and bank address 612. In addition, the virtual synchronous Flash address space 600 contains extended addresses for segment addressing 602 and row addressing 604 that allow for the direct access of the virtual synchronous Flash without logical mapping by compatible host controllers.

In the example 4M×32 virtual synchronous Flash of FIG. 5, address lines A12–A13 are used for extended row accesses into four times as many physical rows (16,384 rows) that a virtual synchronous Flash has as compared to a compatible conventional 4M×32 SDRAM (4,096 rows). Address lines A14–A15 are used for selecting which segment section of four (i.e., 300, 302, 304, and 306 of FIG. 3) of the virtual synchronous Flash's currently active memory array bank (i.e., 308 of FIG. 3) are accessed in the operation.

Figure 7:
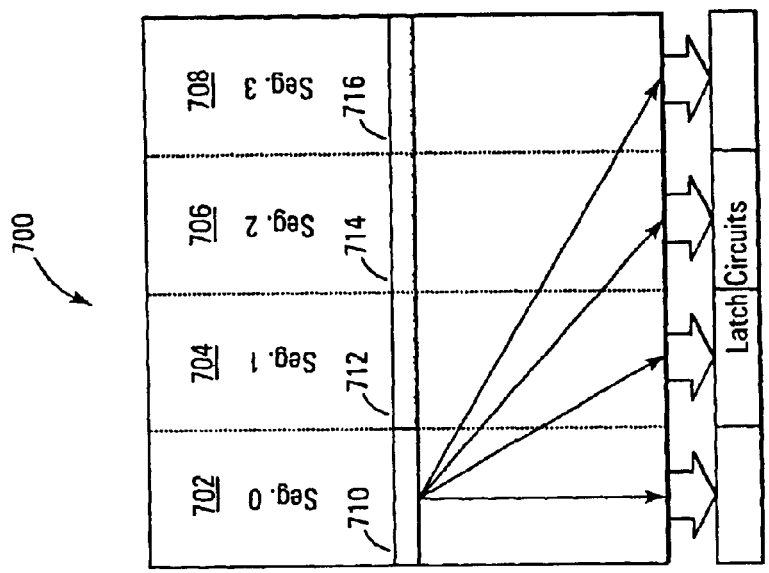
FIG. 7 illustrates a bank of virtual synchronous Flash memory array of the present invention showing mapping of a segment to other segment positions within the bank.

A virtual synchronous Flash memory device's capability to set its segment address allows for full segment association within the bank as shown in FIG. 7. In FIG. 7 is shown a bank of virtual synchronous Flash memory 700 with four segments 702, 704, 706, and 708 that has been logically re-mapped to an SDRAM configuration. A row of the segment zero 710 is shown being logically repositioned by an access that includes an extended virtual synchronous Flash segment address to appear as if it was placed in one of the other three segments of the current memory bank (segment one 712, segment two 714, or segment three 716). The ability of full segment association allows any row selected in a bank to be addressed to any of the four segments in that bank. This has the effect of logically shifting the address space by that number of segments for a subsequent memory access.

In operation, a virtual synchronous Flash memory reduces the active page of the internal memory array bank by one-fourth. This reduces the number of sense amplifiers activating by one-fourth, saving power and complexity. In the example 4M×32 virtual synchronous Flash, the memory device only activates 2K sense amplifiers versus 8K sense amplifiers for an SDRAM or synchronous Flash memory device. In addition, because sixteen segments are available for the virtual synchronous Flash memory device versus four segments for an SDRAM, when each of the four banks has their respective four segments activated, there is a higher hit rate for READs without activating new rows. The increased granularity of a virtual synchronous Flash memory device decreases power usage, and in addition, decreases memory access latency. Therefore effectively increasing bandwidth to the virtual synchronous Flash over that of a conventional synchronous Flash component.

Figure 8:
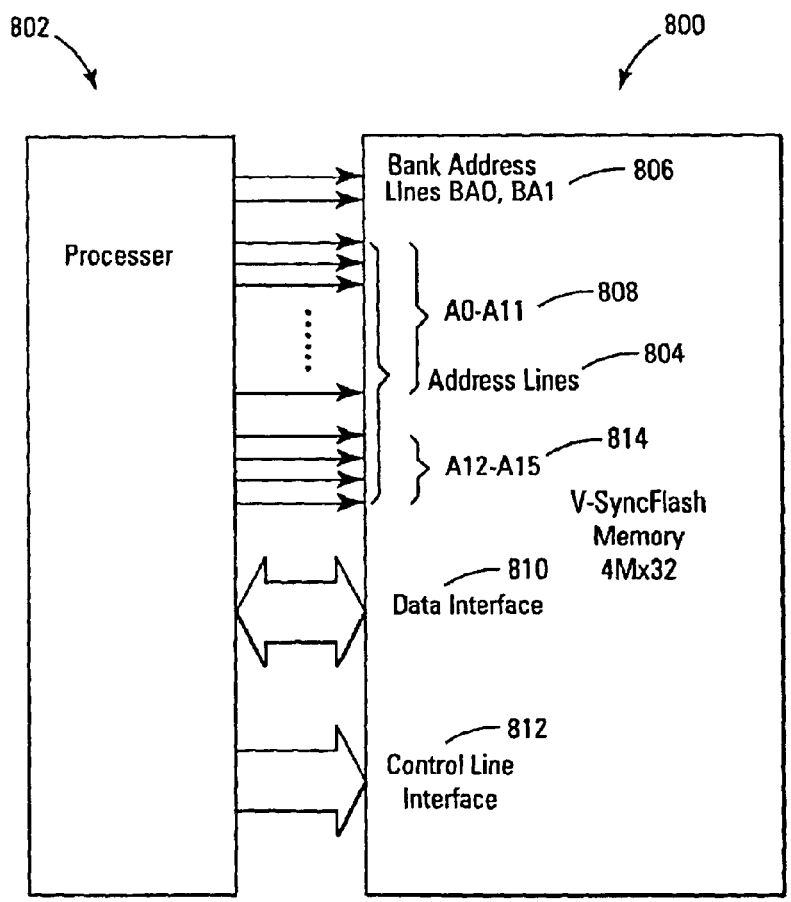
FIG. 8 is a block diagram of a virtual synchronous Flash memory device coupled to an external processor.

FIG. 8 shows an illustration of a virtual synchronous Flash memory system, wherein a 4M×32 virtual synchronous Flash memory device 800 of an embodiment of the present invention is coupled to an external processor 802. It is noted that the virtual synchronous Flash memory system of FIG. 8 is only shown as an example, and other systems and embodiments of the present invention can include multiple types of other integrated circuits (i.e., a memory controller, a field programmable gate array (FPGA), a volatile memory device, an application specific integrated circuit (ASIC), etc.). Systems containing memory devices are well known in the prior art and the following description is intended only to be an overview of their operation and provide an example of their operation with an embodiment of the present invention.

In the system of FIG. 8, address values for the virtual synchronous Flash memory 800 are received from the processor 802 on the external address bus connections 804 and bank address lines 806. The received address values are stored internal to the memory device and utilized to select the memory cells in the internal memory array (not shown). In a conventional SDRAM compatible operation, the processor 802, with an ACTIVE command, inputs a row and bank address on address lines A0–A11 808 and bank address lines BA0 and BA1 806 activating an internal virtual row page (not shown) in the virtual synchronous Flash memory device 800. The row and bank address is followed by a READ command with a column address placed on address lines A0–A8 (a subset of address lines A0–A11 808) by the processor 802. Internal to the virtual synchronous Flash memory device 800, data values from the bank segments (not shown) are captured in latch circuits, logically re-mapped to form an SDRAM compatible data format, and readied for transfer from the virtual synchronous Flash memory device 800. Data transfer from the virtual synchronous Flash memory device 800 begins on the following clock cycle received and transmitted on the bi-directional data word interface 810 to the processor 802. Control of the virtual synchronous Flash memory device 800 for operations is actuated by the internal control circuitry (not shown). The control circuitry operates in response external control signals received from the processor 802 on control signal external interface connections 820 and to internal events.

Extended access to the virtual synchronous Flash memory device 800 is accomplished utilizing the extended virtual synchronous Flash address lines, A12–A15 814. The processor 802, with an ACTIVE command, inputs a row on address lines A0–A11 808, extended row and segment address lines A12–A15 814, and bank address lines BA0 and BA1 806. The ACTIVE command directly activates a bank and internal row page and/or segment of the internal memory array (not shown) in the virtual synchronous Flash memory device 800 for further operations. The row, extended row, and bank address is followed by a READ command with a column address placed on address lines A0–A8 (a subset of address lines A0–A15 804) by the processor 802. Internal to the virtual synchronous Flash memory device 800, data values from the bank segments (not shown) are readied for transfer from the virtual synchronous Flash memory device 800 by being copied into internal latch circuits (not shown). Data transfer from or to the virtual synchronous Flash memory device 800 begins on the following clock cycle received and transmitted on the bi-directional data word interface 810 to the processor 802. Control of the virtual synchronous Flash memory device 800 for operations is actuated by the internal control circuitry (not shown). The control circuitry operates in response external control signals received from the processor 802 on control signal external interface connections 820 and to internal events.

Figure 9:
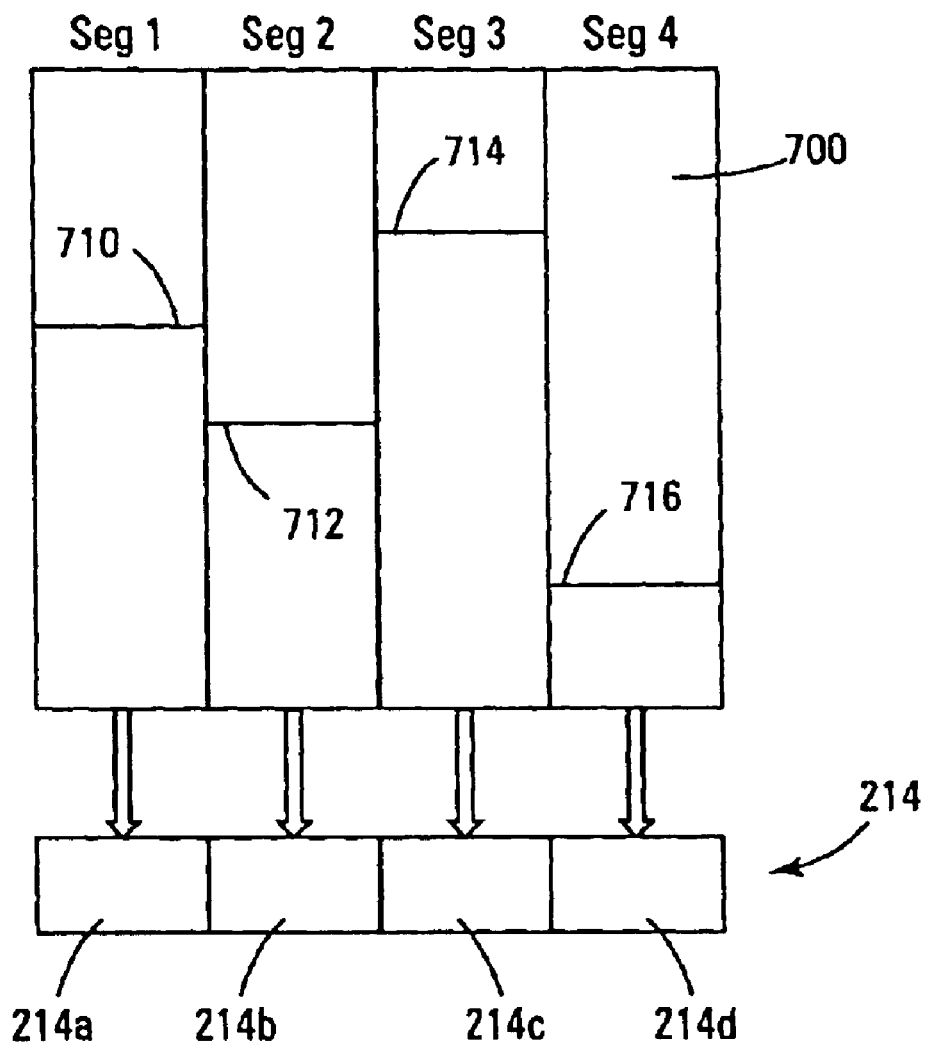
FIG. 9 illustrates a bank of virtual synchronous Flash memory array of the present invention showing segment row read operations.

As explained above, the present memory device allows the data contents of the array bank segments to be mapped to form a row of output data. FIG. 9 illustrates the bank and latch circuitry of FIG. 7 in greater detail during a read operation. The bank is divided into four segments and each segment corresponds to a segment latch 214a–214d of latch circuitry 214. The full segment association within the bank, explained above, allows different segment rows 710, 712, 714 and 716 to be latched in a segment latch. The segment rows do not have to have a common row address. As such, the latch circuitry 214 latches a "virtual row" of data that comprises data from multiple segment row addresses. This allows a system greater access to data stored in the array banks.

Figure 10:
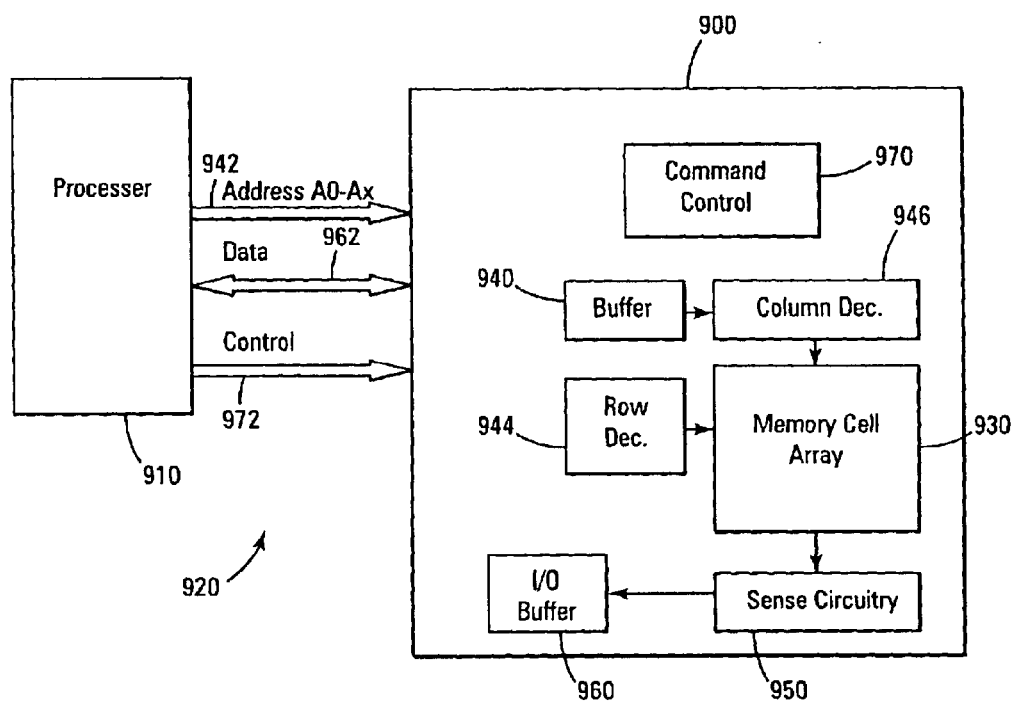
FIG. 10 is a block diagram of a memory device of an embodiment of the present invention.

FIG. 10 is a functional block diagram of a memory device 900, of one embodiment of the present invention, that is coupled to a processor 910. The memory device 900 and the processor 910 may form part of an electronic system 920. The memory device 900 has been simplified to focus on features of the memory that are helpful in understanding the present invention. The memory device includes an array of memory cells 930. The memory cells are preferably non-volatile floating-gate memory cells and generally have their control gates coupled to word lines, drain regions coupled to local bit lines, and source regions commonly coupled to a ground potential. The memory array 930 is arranged in banks of rows and columns. Each bank is arranged in erase blocks. During an erase operation, the memory cells of the erase block are placed in an erased state. Data, however, may be stored in the memory array 930 separate from the block structure.

An address buffer circuit 940 is provided to latch address signals provided on address input connections A0–Ax 942. Address signals are received and decoded by row decoder 944 and a column decoder 946 to access the memory array 930. It will be appreciated by those skilled in the art, with the benefit of the present description, that the number of address input connections depend upon the density and architecture of the memory array. That is, the number of addresses increases with both increased memory cell counts and increased bank and block counts.

The non-volatile memory cells are fabricated as floating gate memory cells and include a source region and a drain region that is spaced apart from the source region to form an intermediate channel region. A floating gate, typically made of doped polysilicon, is disposed over the channel region and is electrically isolated from the other cell elements by oxide. For example, gate oxide can be formed between the floating gate and the channel region. A control gate is located over the floating gate and is can also made of doped polysilicon. The control gate is electrically separated from the floating gate by another dielectric layer. Thus, the floating gate is "floating" in dielectric so that it is insulated from both the channel and the control gate.

The program and erase operations are not performed in single steps. That is, successive program pulses are applied to the memory cells to program a memory cell. This approach reduces over-programming. In a similar manner, the erase operation is iterative. In one embodiment, the erase operation includes three primary steps. The first is a pre-program operation in which all of the memory cells of an erase block are programmed. After all of the cells are pre-programmed, successive erase pulses are applied to the memory cells to remove the pre-program charge from the floating gate. A soft-program operation can be performed to 'heal' any over-erased memory cells.

The memory device reads data in the array 930 by sensing voltage changes in the memory array columns using sensing circuitry 950. The sensing circuitry, in one embodiment, is coupled to read and latch a row of data from the memory array. The row data can be one continuous address, or comprised of partial rows of discontinuous addresses.

Data input and output buffer circuitry 960 is included for bi-directional data communication over a plurality of data (DQ) connections 962 with the processor 910. The timing of data communication can vary depending upon the architecture. In one embodiment, data read from the memory can be output on the data connections with read latency. Read latency, as known to those skilled in the art, is the number of clock cycles between a read command and available data on the output connections. In addition, the memory can operate in a burst mode and allows read-while-write capabilities to different array banks.

Command control circuit 970 decodes signals provided on control connections 972 from the processor 910. These signals are used to control the operations on the memory array 930, including data read, data write, and erase operations. During operation, commands are provided on the control connections, such as ACTIVE, READ and WRITE commands. An ACTIVE command is used to open (or activate) a row in a particular array bank for a subsequent access. A selected row generally remains active for accesses until the next ACTIVE command. The READ command is used to initiate a read access to an active row. The address connections are used to select a starting column location. Read data appears on the DQs subject to a read latency value. A WRITE command is used to initiate a single-location write access on an active row. Input data appearing on the DQs is written to the memory array.

The flash memory device of FIG. 10 has been simplified to facilitate a basic understanding of the features of the memory. A more detailed understanding of internal circuitry and functions of flash memories are known to those skilled in the art.

Figure 11:
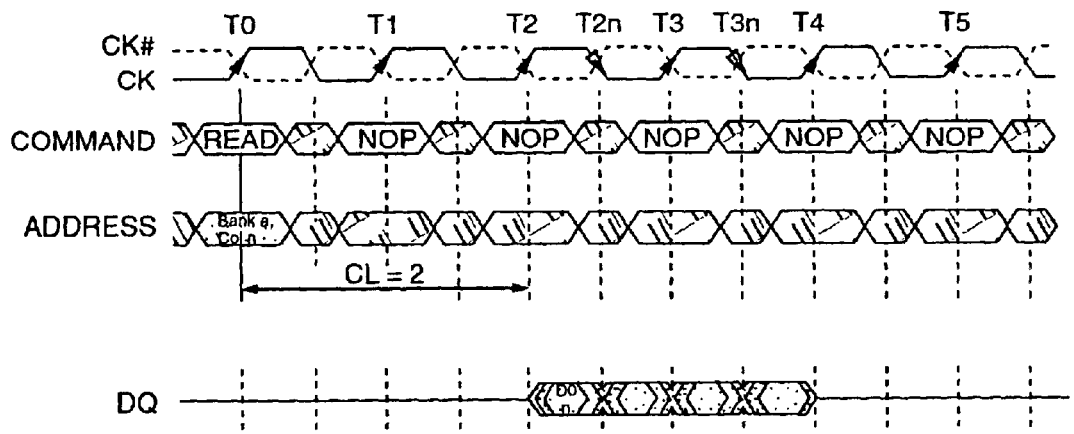
FIG. 11 is a timing diagram of a double data rate read operation of the memory of FIG. 10.

FIG. 11 illustrates a double data rate read operation of the memory of FIG. 10. The read operation is performed on an open row(s) that have been latched in the sense circuitry. As explained above, the segmented bank architecture of the array allow a virtual row to be compiled by latching data from different rows of the segments. This data is output on the data connections following a READ command. The timing of the first output data is dependent upon a selected clock latency. The illustrated read has a clock latency of two. The data is output from the row latch circuitry on the data connections (DQ) in synchronization with both the rising and falling edges of the clock signal (CK).

Figure 12:
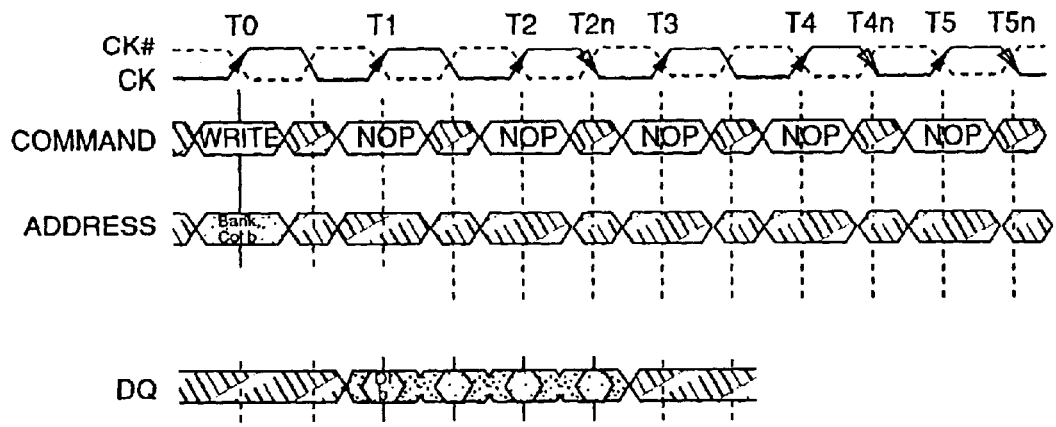
FIG. 12 is a timing diagram of a double data rate write operation of the memory of FIG. 10.

FIG. 12 illustrates a double data rate write operation of the memory of FIG. 10. The data is latched from the data connections (DQ) in synchronization with both the rising and falling edges of the clock signal (CK). In one embodiment, the data is latched in a buffer circuit and subsequently written to the memory array. As such, the data is not written to the memory cells in synchronization with the clock signal.

Conclusion

An improved memory device and architecture has been detailed that enhances a Flash memory device that has an SDRAM compatible interface. The memory device employs a virtual paging scheme that allows for the architecture of the memory to implement an efficient Flash memory structure internally. Externally, the memory logically maps the internal Flash architecture to an SDRAM compatible interface and virtual architecture, allowing for memory access and operation with a compatible SDRAM controller device. A double data rate interface is provided to allow data to be input and output from the memory in synchronization with both rising and falling edges of a clock signal.

Although specific embodiments have been illustrated and described herein, it will be appreciated by those of ordinary skill in the art that any arrangement, which is calculated to achieve the same purpose, may be substituted for the specific embodiment shown. This application is intended to cover any adaptations or variations of the present invention. Therefore, it is manifestly intended that this invention be limited only by the claims and the equivalents thereof.

What is claimed is:

1. A synchronous flash memory device comprising:
   a first memory array with a first memory array dimensionality;
   a control circuit;
   a synchronous memory interface, wherein the control circuit is adapted to logically adapt the first memory array dimensionality to a second memory array dimensionality; and
   wherein the synchronous memory interface is adapted to communicate data on the rising and falling edges of an externally provided clock.

2. The synchronous flash memory device of claim 1, wherein the memory array further comprises a plurality of array banks.

3. The synchronous flash memory device of claim 2, wherein the plurality of array banks each have a first row dimension and a first column dimension, and where the control circuit is adapted to logically adapt the first row dimension and the first column dimension of each array bank to a second row dimension and a second column dimension.

4. The synchronous flash memory device of claim 3, wherein the second row dimension and the second column dimension are the same as a DDR memory device.

5. The synchronous flash memory device of claim 2, wherein each array bank of the plurality of array banks further comprise a plurality of segments.

6. The synchronous flash memory device of claim 5, wherein each array bank of the plurality of array banks comprise four segments.

7. A synchronous non-volatile memory device comprising:
   a memory array with a plurality of array banks, each array bank having a first number of rows and a first number of columns;
   a synchronous memory interface, wherein, for each array bank of the plurality of array banks, wherein the synchronous memory interface is adapted to logically adapt the first number of rows and the first number of columns to a second number of rows and a second number of columns; and
   wherein the synchronous memory interface is adapted to communicate data on a rising edge and a falling edge of an externally provided clock.

8. The synchronous flash memory device of claim 7, wherein the plurality of array banks equal four array banks.

9. The synchronous flash memory device of claim 7, wherein each array bank of the plurality of array banks further comprise a plurality of segments.

10. The synchronous flash memory device of claim 9, wherein the plurality of segments are divided by a row range.

11. The synchronous flash memory device of claim 9, wherein each array bank of the plurality of array banks comprises four segments.

12. The synchronous flash memory device of claim 7, wherein the second number of rows and the second number of columns matches that of a DDR memory.

13. A synchronous flash memory device comprising:
   a first memory array with a first memory array dimensionality;
   a control circuit, wherein the control circuit is adapted to logically adapt the first memory array dimensionality to a second memory array dimensionality; and
   a synchronous memory interface, wherein the synchronous memory interface comprises,
   an address interface,
   a data interface,
   a control interface, and
   wherein the data interface is adapted to communicate data on the rising and falling edges of an externally provided clock.

14. The synchronous flash memory device of claim 13, wherein the address interface further comprises an extended address interface, wherein the extended address interface allows extended access to the synchronous flash memory device.

15. The synchronous flash memory device of claim 14, wherein the extended address interface further allows access to the first memory dimensionality.

16. A synchronous flash memory device comprising:
   a first memory array with a plurality of array banks, each having a first row dimension and a first column dimension;
   a control circuit, wherein the control circuit is adapted to logically adapt the first row dimension and the first column dimension of each of the plurality of banks to a second row dimension and a second column dimension;
   a synchronous memory interface, wherein the synchronous memory interface comprises,
   an address interface,
   an extended address interface,
   a data interface, and
   a control interface; and
   wherein the synchronous memory interface is adapted to communicate data on the rising and falling edges of an externally provided clock.

17. The synchronous flash memory device of claim 16, wherein the extended address interface is adapted to allow access to the first row dimension.

18. The synchronous flash memory device of claim 16, wherein the extended address interface is adapted to allow access to the first column dimension.

19. The synchronous flash memory device of claim 16 wherein the extended address interface further comprises an additional address interface is adapted to allow access to the first row dimension of the synchronous flash memory device.

20. The synchronous flash memory device of claim 19, wherein the additional address interface has two address lines and is adapted to allow access into the first row dimension of the synchronous flash memory device.

21. The synchronous flash memory device of claim 16, wherein the plurality of array banks further comprise a plurality of segments, and wherein the extended address interface further comprises an additional address interface adapted to select a segment of an active bank of the synchronous flash memory device.

22. The synchronous flash memory device of claim 21, wherein the additional address interface has two address lines is adapted to allow selection of the segment of the active bank of the synchronous flash memory device.

23. The synchronous flash memory device of claim 21, wherein the additional address interface is adapted to allow associating an active row of a selected segment with any other segment in the active bank of the synchronous flash memory device.

24. A method of operating a synchronous non-volatile memory device comprising:
dividing a memory array with a first memory array dimensionality into a plurality of sections;
logically adapting the plurality of sections of the memory array to form an emulated virtual second memory array dimensionality; and
communicating data on the rising and falling edges of an externally provided clock.

25. The method of claim 24, wherein dividing the memory array into a plurality of sections further comprises dividing the memory array into a plurality of array banks.

26. The method of claim 25, wherein dividing the memory array into the plurality of array banks further comprises dividing the memory array into a plurality of array banks such that the array banks have a first row dimension and a first column dimension.

27. The method of claim 26, wherein logically adapting the plurality of sections of the memory array to form the emulated virtual second memory array dimensionality further comprise logically adapting the first row dimension and the first column dimension of each array bank to a second row dimension and a second column dimension.

28. The method of claim 27, wherein logically adapting the first row dimension and the first column dimension of each array bank to a second row dimension and a second column dimension further comprise logically adapting the first row dimension and the first column dimension of each array bank to a second row dimension and a second column dimension, where the second row dimension and the second column dimension are the same as a DDR memory device.

29. The method of claim 25, wherein dividing the memory array into the plurality of array banks further comprises dividing each array bank into a plurality of segments.

30. A method of operating a synchronous flash memory device comprising:
dividing a memory array with a first memory array dimensionality into a plurality of array banks;
dividing each array bank of the plurality of array banks into a plurality of segments;
logically adapting the plurality of array banks and plurality of segments of the first memory array dimensionality of the memory array to form an emulated virtual second memory array dimensionality, wherein accessing the emulated virtual second memory array dimensionality occurs through a synchronous memory interface on the rising and falling edges of a clock signal; and
allowing access to the first memory array dimensionality of the memory array through the synchronous memory interface and an extended interface on the rising and falling edges of the clock signal.

31. The method of claim 30, wherein allowing access to the first memory array dimensionality of the memory array through the synchronous memory interface and an extended interface on the rising and falling edges of the clock signal further comprises allowing access to the first row dimension of each array bank through the synchronous memory interface and an extended interface on the rising and falling edges of the clock signal.

32. The method of claim 30, wherein allowing access to the first memory array dimensionality of the memory array through the synchronous memory interface and an extended interface on the rising and falling edges of the clock signal further comprises allowing access to the first column dimension of each array bank of the plurality of array banks through the synchronous memory interface and an extended interface on the rising and falling edges of the clock signal.

33. The method of claim 31, wherein allowing access to the first memory array dimensionality of the memory array through the synchronous memory interface and an extended interface on the rising and falling edges of the clock signal further comprising allowing access to the first memory array dimensionality of the memory array through the synchronous memory interface and an extended interface on the rising and falling edges of the clock signal, where an additional address interface of the extended interface allows selection of a segment of an active bank of the synchronous flash memory device.

34. The method of claim 33, wherein the additional address interface allows associating an active row of a selected segment with any other segment in the active bank of the synchronous flash memory device.

35. A method of logically mapping a synchronous non-volatile memory device comprising:
dividing each bank of a first plurality of banks in a first memory array into a plurality of segments;
logically mapping the plurality of segments to appear as a second memory array with a second plurality of segments; and
communicating data from the second memory array on the rising and falling edges of an externally provided clock.

36. A system comprising:
a synchronous memory controller; and
a synchronous flash memory device, wherein the synchronous flash memory device comprises,
a memory array with a first memory array dimensionality,
a control circuit,
a synchronous memory interface,
wherein the control circuit is adapted to logically adapt the first memory array dimensionality to a second memory array dimensionality, and
wherein the synchronous memory interface is adapted to transfer data on the rising and falling edges of an externally provided clock.

37. The system of claim 36, wherein the synchronous memory controller further comprises one of a processor, an ASIC, and an FPGA.

* * * * *

UNITED STATES PATENT AND TRADEMARK OFFICE
CERTIFICATE OF CORRECTION

PATENT NO.    : 6,845,057 B2
DATED         : January 18, 2005
INVENTOR(S)   : Kevin C. Widmer et al.

It is certified that error appears in the above-identified patent and that said Letters Patent is hereby corrected as shown below:

Column 5,
Line 37, "data element from the READ burst, provided that 11O" should read
-- data element from the READ burst, provided that I/O --.

Signed and Sealed this

Seventh Day of March, 2006

JON W. DUDAS
*Director of the United States Patent and Trademark Office*